United States Patent
Kaneko et al.

(10) Patent No.: US 10,281,214 B2
(45) Date of Patent: May 7, 2019

(54) HEAT TREATMENT APPARATUS

(71) Applicant: TOKYO ELECTRON LIMITED, Tokyo (JP)

(72) Inventors: Hirofumi Kaneko, Oshu (JP); Kenichi Chiba, Oshu (JP)

(73) Assignee: TOKYO ELECTRON LIMITED, Tokyo (JP)

(*) Notice: Subject to any disclaimer, the term of this patent is extended or adjusted under 35 U.S.C. 154(b) by 527 days.

(21) Appl. No.: 14/020,190

(22) Filed: Sep. 6, 2013

(65) Prior Publication Data
US 2014/0072924 A1    Mar. 13, 2014

(30) Foreign Application Priority Data

Sep. 7, 2012 (JP) .................. 2012-197717

(51) Int. Cl.
| | | |
|---|---|---|
| F27D 7/02 | (2006.01) | |
| F27D 7/06 | (2006.01) | |
| F27B 17/00 | (2006.01) | |
| H01L 21/67 | (2006.01) | |
| H01L 21/687 | (2006.01) | |

(52) U.S. Cl.
CPC ............ *F27D 7/02* (2013.01); *F27B 17/0025* (2013.01); *F27D 7/06* (2013.01); *H01L 21/67109* (2013.01); *H01L 21/68792* (2013.01)

(58) Field of Classification Search
CPC .................................... F27D 7/02; F27D 7/06
USPC .................................................. 432/198, 200
See application file for complete search history.

(56) References Cited

U.S. PATENT DOCUMENTS

| | | | | | |
|---|---|---|---|---|---|
| 5,016,567 A | * | 5/1991 | Iwabuchi | ............... | C23C 16/44 118/715 |
| 5,065,495 A | * | 11/1991 | Narushima | ........... | B25B 11/005 269/21 |
| 5,421,892 A | * | 6/1995 | Miyagi | .................. | C23C 16/46 118/724 |
| 5,799,951 A | * | 9/1998 | Anderson | ............... | F16J 15/43 277/301 |
| 6,030,457 A | * | 2/2000 | Shimazu | ............. | C23C 16/4401 118/715 |

(Continued)

FOREIGN PATENT DOCUMENTS

| | | |
|---|---|---|
| JP | 6-204157 A | 7/1994 |
| JP | 2000-114193 A | 4/2000 |

(Continued)

*Primary Examiner* — Steven B McAllister
*Assistant Examiner* — John Bargero
(74) *Attorney, Agent, or Firm* — Nath, Goldberg & Meyer; Jerald L. Meyer

(57) ABSTRACT

A heat treatment apparatus is provided with a reaction tube having a furnace opening formed at a lower end thereof, a lid body configured to hermetically seal the furnace opening of the reaction tube, a heat treatment boat supported on the lid body through a leg, and a rotating shaft extending through the lid body. The rotating shaft is connected to a lower end of the leg and configured to rotate the leg. The lid body is provided with a surrounding ring protruding upward to surround the lower end of the leg. An inert gas is supplied from an inert gas supply unit to a space between the lid body and the rotating shaft and discharged from a space between the lower end of the leg and the surrounding ring into the reaction tube.

6 Claims, 3 Drawing Sheets

(56) References Cited

U.S. PATENT DOCUMENTS

| | | | |
|---|---|---|---|
| 6,187,102 B1* | 2/2001 | Yamamoto | C23C 16/4401 |
| | | | 118/725 |
| 8,246,749 B2* | 8/2012 | Wang | C23C 16/4401 |
| | | | 118/733 |
| 2006/0231391 A1* | 10/2006 | Mullapudi | C23C 14/352 |
| | | | 204/298.11 |

FOREIGN PATENT DOCUMENTS

| JP | 2000-216105 A | 8/2000 |
|---|---|---|
| JP | 2003-257958 A | 9/2003 |

* cited by examiner

HEAT TREATMENT APPARATUS

CROSS-REFERENCE TO RELATED APPLICATION

This application claims the benefit of Japanese Patent Application No. 2012-197717, filed on Sep. 7, 2012, in the Japan Patent Office, the disclosure of which is incorporated herein in its entirety by reference.

TECHNICAL FIELD

The present disclosure relates to a heat treatment apparatus including a heat treatment furnace, a lid body, a heat treatment boat supported by a leg, and a rotating shaft connected to the leg and extending through the lid body. More particularly, the present disclosure pertains to a heat treatment apparatus for preventing a process gas from infiltrating through a gap between the leg and the lid body.

BACKGROUND

In the manufacture of a semiconductor device, various kinds of heat treatments such as oxidization, diffusion, CVD and annealing are performed with respect to a target object to be processed, e.g., a semiconductor wafer. An example of a heat treatment apparatus for performing these processes is a vertical heat treatment apparatus capable of performing concurrent heat treatment on multiple wafers.

In general, a vertical heat treatment apparatus includes a lid body vertically movable to open and close a furnace opening for a reaction tube of a heat treatment furnace. A heat treatment boat for supporting a plurality of wafers at multiple stories along an up-down direction is installed on the lid body. The heat treatment boat is supported by a leg which is rotated by a rotating shaft extending through the lid body.

An inert gas is supplied to a space between the leg and the lid body in order to prevent a process gas from moving toward a side of the rotating shaft from the space between the leg and the lid body.

In some vertical heat treatment apparatuses, an inert gas is supplied to a gap between the leg of the heat treatment boat and the lid body and discharged into the heat treatment furnace. However, it is difficult to adjust the gap between the leg of the heat treatment boat and the lid body. Sometimes, the inert gas cannot be sufficiently and reliably discharged from the gap between the leg and the lid body into the reaction tube.

More specifically, a horizontal purge flow path is formed by a seat member for the leg and a lid body. In this case, the purge flow path is formed as a gap of 0.2 to 0.5 mm in height by a pull screw and a push screw. A collapse of balance due to the repeated thermal expansion and contraction of the screws or the degradation over time may occur. Such a collapse may disrupt the gap from maintaining the predetermined distance, and there may be a problem that the seat member and the lid body come in contact with each other to generate unwanted particles. Moreover, if a $N_2$ purge flow rate is reduced when the size of the gap is not large enough to serve as the purge flow path, a problem occurs in that a cleaning gas is reversely diffused, thereby corroding a hub of the rotating shaft.

SUMMARY

Some embodiments of the present disclosure provide a heat treatment apparatus capable of sufficiently and reliably discharging an inert gas from a gap between a leg of a heat treatment boat and a lid body into a reaction tube and capable of reliably preventing a process gas from moving into the gap between the leg and the lid body.

The present disclosure suggests a heat treatment apparatus, including a reaction tube having a furnace opening formed at a lower end thereof, a lid body configured to hermetically seal the furnace opening of the reaction tube, a heat treatment boat supported on the lid body through a leg, and a rotating shaft extending through the lid body, the rotating shaft connected to a lower end of the leg and configured to rotate the leg, wherein the lid body includes a surrounding ring protruding upward to surround the lower end of the leg, and an inert gas is supplied from an inert gas supply unit to a space between the lid body and the rotating shaft and discharged from a space between the lower end of the leg and the surrounding ring into the reaction tube.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will now be described in detail with reference to FIGS. 1 through 3.

Figure 1:
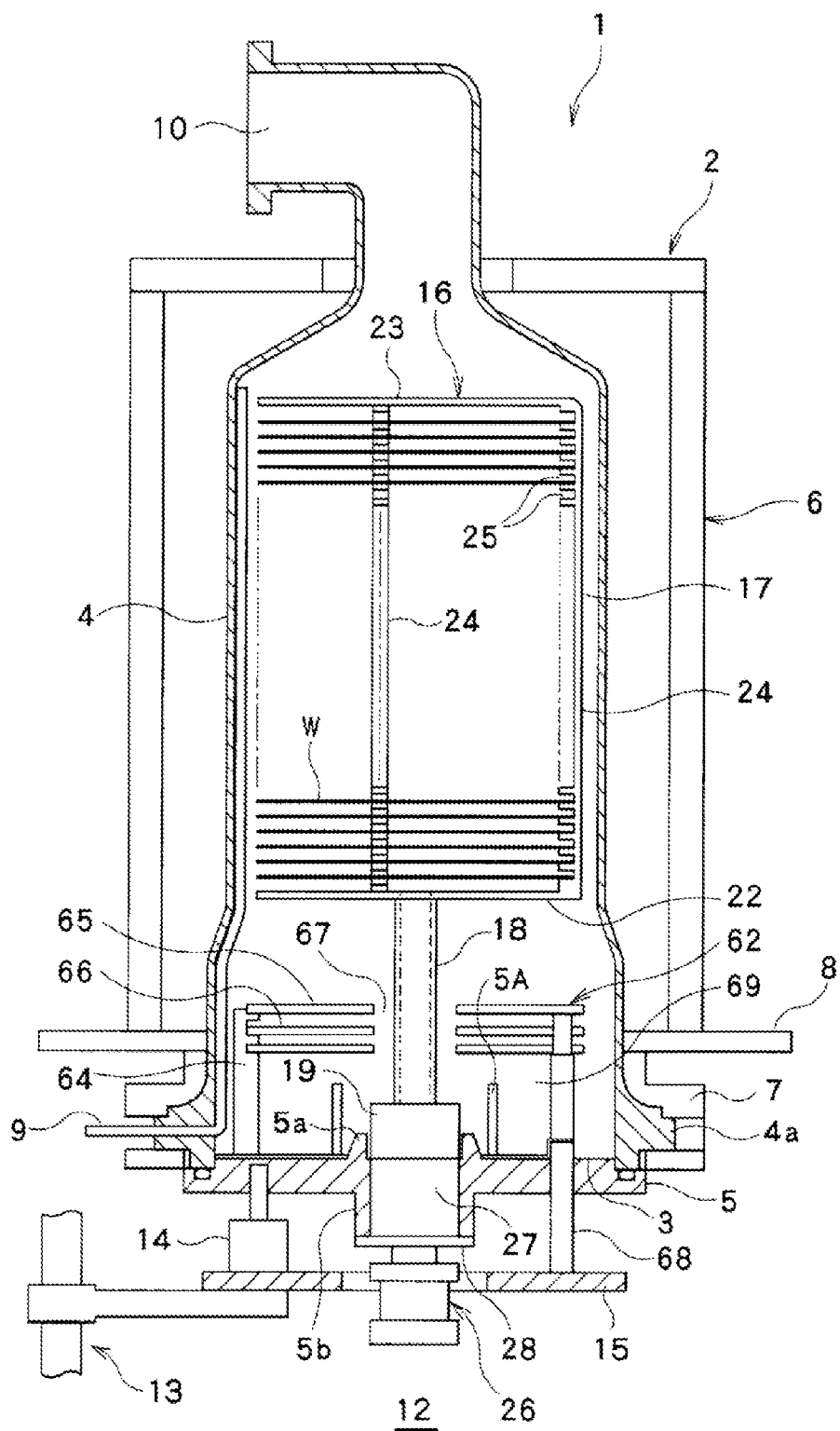
FIG. 1 is a longitudinal sectional view showing a heat treatment apparatus according to one embodiment.

Referring to FIG. 1, the vertical heat treatment apparatus 1 includes a vertical heat treatment furnace 2 for accommodating a target object to be processed, e.g., a semiconductor wafer W, to perform a specified process, e.g., a CVD process. The heat treatment furnace 2 includes a reaction tube 4 as a vertically-elongated processing vessel made of, e.g., quartz and provided with a furnace opening 3 formed at a lower end thereof, a lid body 5 vertically movable to open and close the furnace opening 3 of the reaction tube 4 and a heater 6 installed around the reaction tube 4 and provided with a heat-generating resistor capable of heating the inside of the reaction tube (furnace) 4 to a predetermined temperature, e.g., 300 to 1200 degrees C.

The reaction tube 4 is formed of a single-tube and made of, e.g., quartz. An outwardly-extending flange 4a is formed at the lower end of the reaction tube 4. The flange 4a is held below a base plate 8 through a flange holding member 7. In this case, the reaction tube 4 extends downward through the base plate 8 while the heater 6 is installed on the base plate 8.

A plurality of gas introduction pipes 9 configured to introduce a process gas or a purge inert gas into the reaction tube 4 is installed in the flange 4a of the reaction tube 4. Pipes of a gas supply system are connected to the gas introduction pipes 9. The top portion of the reaction tube 4 has a diameter that is gradually decreasing upward. An exhaust port 10 is formed at the top portion of the reaction tube 4. Pipes of an exhaust system (not shown) including a vacuum pump, a pressure control valve and so forth capable of depressurizing the inside of the reaction tube 4, are connected to the exhaust port 10.

Formed below the heat treatment furnace 2 is a work area (or a loading area) 12 for loading a heat treatment boat (often simply referred to as a boat) 16 arranged on the lid body 5 into the heat treatment furnace 2 (i.e., the reaction tube 4), unloading the heat treatment boat 16 from the heat treatment furnace 2, or transferring a wafer W with respect to the boat 16. A lift mechanism 13 for moving the lid body 5 up and down to load and unload the boat 16 is installed in the work area 12.

The lid body 5 is formed into a lid body made of, e.g., SUS (stainless steel), and is held on a holder plate 15 through a plurality of shock-absorbing mechanism 14. The holder plate 15 is connected to the lift mechanism 13. The lid body 5 makes contact with the open end of the furnace opening 3 and hermetically seals the furnace opening 3. A rotation mechanism 26 configured to rotate the boat 16 and provided with a rotating shaft 27 made of ceramics such as silicon nitride or the like is installed at the lower central portion of the lid body 5.

The heat treatment boat 16 is formed into a boat made of, e.g., quartz. The heat treatment boat 16 includes a boat body 17 for supporting a plurality of, e.g., about 75 to 100, wafers W having a large diameter of, e.g., 300 mm, on multiple horizontal stories spaced-apart in an up-down direction and a single leg 18 for supporting the boat body 17. The boat body 17 and the leg 18 are formed of one-piece. The leg 18 of the boat 16 is connected to the rotating shaft 27 for rotating the wafers W in a circumferential direction.

Figure 2:
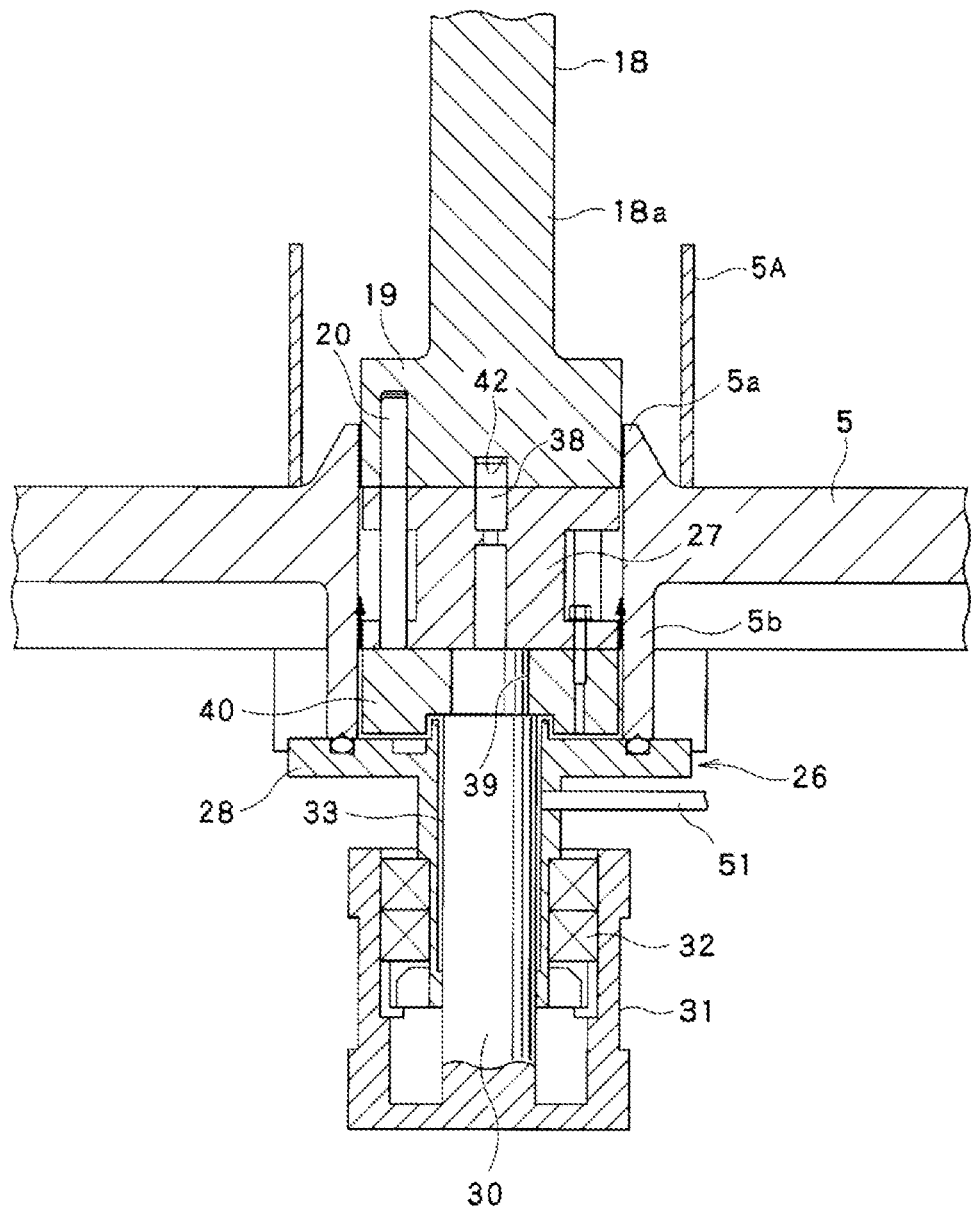
FIG. 2 is an enlarged sectional view of major parts of the heat treatment apparatus.
Figure 3:
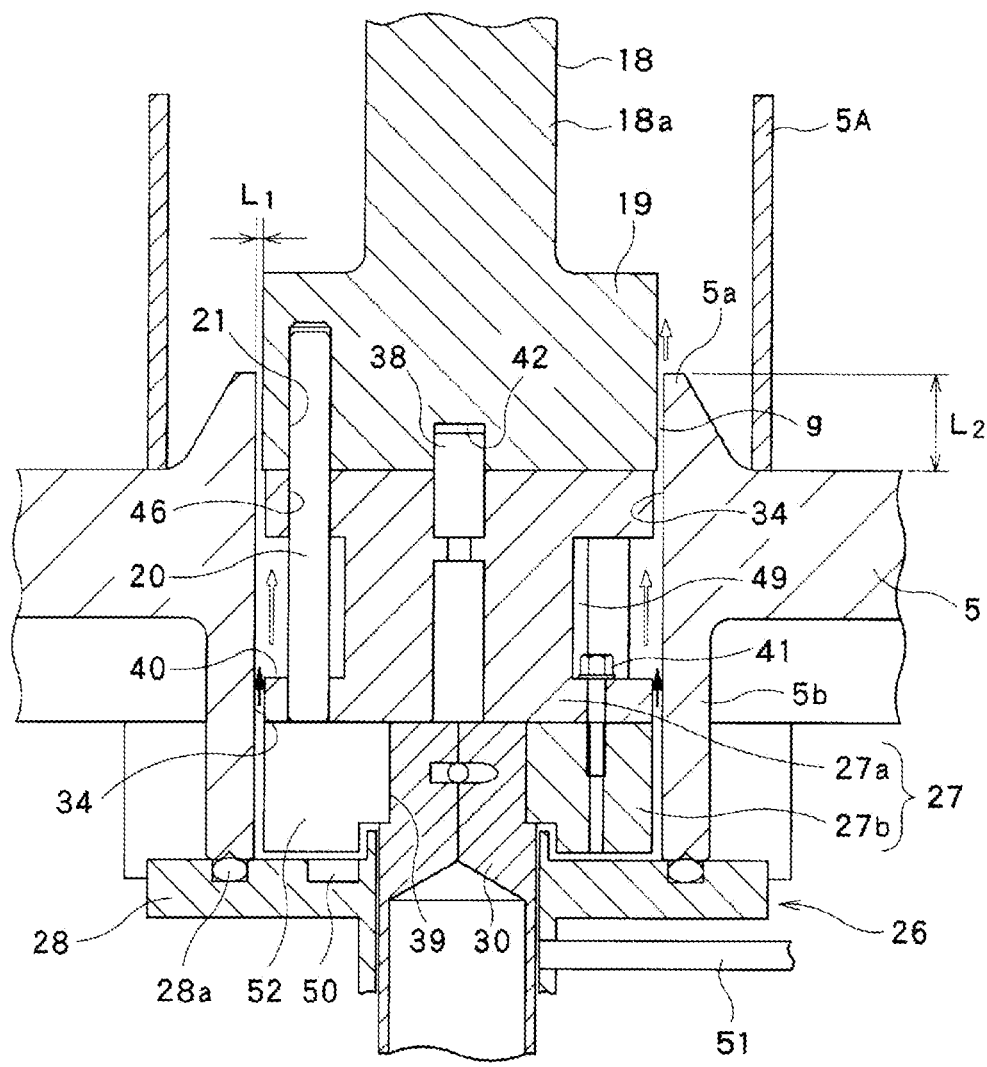
FIG. 3 is an enlarged sectional view illustrating a relation between a leg of a heat treatment boat and a lid body.

As shown in FIG. 2, the leg 18 includes a leg body 18a and a lower flange 19 formed at the lower end of the leg body 18a. The lower flange 19 protrudes radially outward. A plurality of, e.g., six, holes 21 for fastening the lower flange 19 to the rotating shaft 27 with connecting pins 20 is formed at the lower flange 19. In other words, the lower end of the leg 18 is formed into the lower flange 19 protruding outward, while the leg 18 is connected to the rotating shaft 27 through the lower flange 19. In this case, the lower flange 19 and the rotating shaft 27 are connected to each other by the connecting pins 20 embedded in the lower flange 19.

The boat body 17 includes a bottom plate 22, a top plate 23 and a plurality of pillars 24 positioned between the bottom plate 22 and the top plate 23. The pillars 24 are joined to the bottom plate 22 and the top plate 23 by, e.g., welding to form a one-pieced body. The pillars 24 are arranged with a predetermined interval in a circumferential direction so as to surround the wafers W. The front side (the left side in FIG. 1) of the boat body 17 is opened for a transfer mechanism (not shown) to transfer the wafers W in and out. Groove portions 25 for holding the wafers W on multiple stories are formed in the pillars 24. The leg 18 has a predetermined thickness, e.g., an outer diameter of about 20 to 50 mm, and a predetermined height, e.g., a height of about 250 to 350 mm including the lower flange 19.

As stated above, the rotation mechanism 26 includes the rotating shaft 27 and a cylindrical housing 28. The cylindrical housing 28 is formed at the lower central portion of the lid body 5 and configured to rotatably support the rotating shaft 27. A rotating sleeve body 31 of a cylindrical shape with a closed-bottom has a rotating shaft 30 formed in on-piece body at the center axis thereof. The rotating sleeve body 31 is installed around the lower periphery of the housing 28 through ball bearing sets 32. The rotating shaft 30 extends upright from the bottom center of the rotating sleeve body 31. The rotating shaft 30 air-tightly extends into the housing 28 through a sealing means, e.g., an O-ring or a magnetic fluid seal 33.

A motor as a rotation driving means is connected to the rotating sleeve body 31 using a belt (not shown), whereby the rotating shaft 30 is rotated by the motor. A shaft bore 34 through which the rotating shaft 27 extends is formed at the center of the lid body 5.

The lid body 5 includes a surrounding ring 5a protruding upward so as to surround the lower flange 19 of the leg 18. The surrounding ring 5a and the lid body 5 are formed in one-piece. A gap g extending in a vertical direction is formed between the surrounding ring 5a and the lower flange 19. The gap g between the surrounding ring 5a and the lower flange 19 has a size $L_1$ of, e.g., 0.2 mm to 2.0 mm and a height $L_2$ of 10 mm to 40 mm.

Although it is possible to make the thickness of the lid body 5 equal to the height of the surrounding ring 5a, this leads to the needs for a bigger sized driving unit (not shown) of the lift mechanism 13 along with the increase in the weight of the lid body 5. For that reason, it is desirable to form the surrounding ring 5a protruding upward from the lid body 5.

The lid body 5 includes a support ring 5b arranged below the surrounding ring 5a and placed on the housing 28. The surrounding ring 5a and the support ring 5b have identical length inner diameters.

In this case, the support ring 5b and the housing 28 are fixed to each other through an O-ring 28a. The rotating shaft 27 rotates within the support ring 5b.

The quartz-made lower flange 19 and the rotating shaft 27 are fastened to each other by the connecting pins 20.

An inert gas, e.g., nitrogen gas ($N_2$), is supplied along the inner surface of the shaft bore 34 through which the rotating shaft 27 of the lid body 5 extends. The inert gas is discharged from the shaft bore 34 into the reaction tube 4 through the gap g between the lower flange 19 and the surrounding ring 5a.

The rotating shaft 27 includes an upper rotating shaft 27a and a lower rotating shaft 27b. A flange 40 is formed at the lower end of the upper rotating shaft 27a. The upper rotating shaft 27a is fixed to the lower rotating shaft 27b by a fixing screw 41 driven from the side of the flange 40. The rotating shaft 27 includes a centering-purpose protruding shaft 38 at the center of the upper end of the upper rotating shaft 27a. A fitting hole 39 is formed at the center of the lower rotating shaft 27b, into which the upper end of the rotating shaft 30 of the rotation mechanism 26 is fitted. The flange 40 is formed at the lower end of the upper rotating shaft 27a. As mentioned above, the upper rotating shaft 27a is fixed to the lower rotating shaft 27b by the fixing screw 41 driven from the side of the flange 40. The rotating shaft 30 and the lower rotating shaft 27b are fixed to each other by a screw (not shown) driven from the side of the lower rotating shaft 27b.

Holes 46, through which the connecting pins 20 are fitted, are formed at the upper rotating shaft 27a. The connecting pins 20 are seated onto the holes 21 of the lower flange 19.

The holes 46 formed at the upper rotating shaft 27a may be positioning-purpose grooves. Further, it is preferred that an annular groove 49 is formed at the outer circumference of the upper rotating shaft 27a in order to reduce the heat capacity.

Further, in order to prevent a corrosive process gas from infiltrating toward the side of the rotating shaft 27 through a space between the surrounding ring 5a of the lid body 5 and the lower flange 19, as mentioned above, an inert gas, e.g., a nitrogen gas ($N_2$), is introduced from an introduction pipe 51 into the shaft bore 34 of the lid body 5. In other words, as shown in FIGS. 2 and 3, the inert gas supplied to the gap between the housing 28 and the rotating shaft 30 is supplied to the shaft bore 34 through the gap between the lower rotating shaft 27b and the housing 28. Then the inert gas is discharged from the gap g into the reaction tube 4.

The connecting pins 20 for fixing (fastening) the lower flange 19 of the leg 18 to the rotating shaft 27 is made of, e.g., SUS (stainless steel) or Inconel. In order to prevent the connecting pins 20 from being stuck, the connecting pins 20 are coated with a hard super-alloy film composed of, e.g., nickel aluminum (NiAl).

As shown in FIG. 1, a furnace opening heating mechanism 62 as a furnace opening heat-retention means having a space 69 is fixed onto the lid body 5. The furnace opening heating mechanism 62 mainly includes a plurality of posts 64 installed upright on the upper surface of the lid body 5 at a suitable interval along a circumferential direction, a planar heat-generating resistor 65 horizontally bridged over the upper end of the posts 64 and a plurality of, e.g., two, heat shield plates 66 arranged below the heat-generating resistor 65 and bridged over the posts 64 with a suitable interval.

The posts 64 and the heat shield plates 66 are made of, e.g., quartz. A through-hole 67, through which the leg 18 of the boat 16 including the lower flange 19 extends, is formed in the heat-generating resistor 65 and the heat shield plates 66. A guide pipe 68 for guiding a cable through which an electric current is supplied to the heat-generating resistor 65 extends from the holder plate 15 to air-tightly pass through the lid body 5.

A cylindrical shield body 5A surrounding the leg 18 at the outside thereof is installed on the lid body 5. The cylindrical shield body 5A externally surrounds the leg 18, especially, the lower flange 19 to prevent the process gas introduced from the gas introduction pipes 9 into the reaction tube 4 from infiltrating toward the side of the rotating shaft 27 through the gap g between the surrounding ring 5a of the lid body 5 and the lower flange 19 of the leg 18.

Further, the cylindrical shield body 5A is formed so as to be readily positioned in place by a slant surface formed on the outer circumference of the surrounding ring 5a. In other words, the outermost diameter of the surrounding ring 5a is set a little smaller than the inner diameter of the cylindrical shield body 5A.

Next, description will be made on the operation of the present embodiment configured as above.

First, within the work area 12, the wafers W are transferred and mounted into the heat treatment boat 16 arranged on the lid body 5. After the wafers W are mounted into the boat 16, the lid body 5 is moved up by the lift mechanism 13. Then, the lid body 5 makes contact with the open end of the furnace opening 3 and hermetically seals the furnace opening 3.

Then, the reaction tube 4 is externally heated by the heater 6. The process gas is supplied from the gas introduction pipes 9 into the reaction tube 4. Thus, a necessary heat treatment is carried out for the wafers W.

During those operations, the rotating sleeve body 31 is rotated by a motor (not shown). The rotating shaft 30 is rotated together with the rotating sleeve body 31. By the rotation of the rotating shaft 30, the rotating shaft 27 is rotated, and the boat 16 is rotated slowly.

An inert gas (e.g., a $N_2$ gas) is supplied from the inert gas introduction pipe 51 to the gap between the housing 28 and the rotating shaft 30. Then, the inert gas is caused to flow into the shaft bore 34 of the lid body 5.

Thereafter, the inert gas within the shaft bore 34 vertically flows through the gap g between the lower flange 19 of the leg 18 and the surrounding ring 5a of the lid body 5. Then, the inert gas is discharged into the reaction tube 4.

In this manner, during the heat treatment of the wafers W, the inert gas is discharged into the reaction tube 4 through the gap g between the lower flange 19 of the leg 18 and the surrounding ring 5a of the lid body 5. For that reason, there is no possibility that the process gas within the reaction tube 4 flows back toward the rotating shaft 27 through the gap g. It is therefore possible to reliably prevent the rotating shaft 27 from being corroded by the process gas.

It is conceivable that a horizontally-extending gap is formed between the lower flange 19 of the leg 18 and the lid body 5. If the horizontally-extending gap is formed in this manner, there is a need to adjust the vertical dimension between the lower flange 19 of the leg 18 and the lid body 5 with an adjusting screw. Therefore, a problem may occur in that a sufficient amount of inert gas cannot be supplied due to the work mistake or the thermal expansion and contraction of the adjusting screw.

In contrast, according to the present embodiment, the gap g between the lower flange 19 and the surrounding ring 5a can be reliably set by simply placing the lower flange 19 onto the rotating shaft 27 with the position decision by the connecting pins 20. Accordingly, it is possible to sufficiently and reliably discharge the inert gas from the gap between the lower flange 19 of the leg 18 and the surrounding ring 5a into the reaction tube 4.

The connecting pins 20 for interconnecting the rotating shaft 27 and the lower flange 19 are embedded in the lower flange 19 to be not exposed to the outside. For that reason, the process gas within the reaction tube 4 may not infiltrate toward the side of the rotating shaft 27 through the holes 21 into which the connecting pins 20 are fitted.

As mentioned earlier, if the horizontally-extending gap is formed, there is a need to adjust the dimension in a vertical direction of the gap using the adjusting screw. However, according to the present disclosure, it may not be necessary to perform the height adjustment work with the adjusting screw. This makes it possible to reduce the number of work steps and to suppress occurrence of work mistakes.

Since the cylindrical shield body 5A surrounding the leg 18 at the outside thereof is installed on the lid body 5, it may be possible to reliably prevent the process gas within the reaction tube 4 from infiltrating into the gap g between the lower flange 19 and the surrounding ring 5a.

Now, description will be made on the test results of a process gas concentration in the peripheral edge of the lower flange 19 when the cylindrical shield body 5A is installed.

That is, the following tests were conducted in order to confirm the advantageous effects attributable to the installation of the cylindrical shield body 5A.

A 20% $F_2/N_2$ gas was supplied from the gas introduction pipes 9 into the reaction tube 4 at a flow rate of 10 l/min, and an HF gas was supplied at a flow rate of 2 l/min. The $F_2$ concentrations in the peripheral edge of the lower flange 19 were measured in three cases, namely (1) a case where the cylindrical shield body 5A of 70 mm in height is installed, (2) a case where the cylindrical shield body 5A of 40 mm in height is installed and (3) a case where the cylindrical shield body 5A is removed.

The measurement results are shown in Table 1 below.

TABLE 1

| | $F_2$ concentrations (ppm) |
|---|---|
| (1) Cylindrical shield body of 70 mm in height | 1,401 |
| (2) Cylindrical shield body of 40 mm in height | 9,841 |
| (3) Cylindrical shield body removed | 31,322 |

As can be noted from Table 1, the installation of the cylindrical shield body 5A makes it possible to appropriately protect the lower flange 19 from the process gas. In this case, as compared with the case where the cylindrical shield body 5A is removed, the installation of the cylindrical shield body 5A of 70 mm in height makes it possible to protect the lower flange 19 in a reliable manner.

As described above, according to the present disclosure, the inert gas supplied from the space between the lid body and the rotating shaft can be sufficiently and reliably discharged into the reaction tube through the gap between the lower end of the leg of the heat treatment boat and the surrounding ring of the lid body. This may eliminate the possibility for the process gas within the reaction tube to infiltrate through the gap between the lower end of the leg and the surrounding ring of the lid body. Accordingly, it is possible to prevent the process gas from flowing toward the side of the rotating shaft portion.

While certain embodiments have been described, these embodiments have been presented by way of example only, and are not intended to limit the scope of the disclosures. Indeed, the novel apparatus described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
    a reaction tube having a furnace opening formed at a lower end thereof;
    a lid body configured to hermetically seal the furnace opening of the reaction tube;
    a heat treatment boat having a first diameter and supported on the lid body through a leg, which is provided between the lid body and the heat treatment boat;
    a rotating shaft extending through the lid body, the rotating shaft connected to a lower end of the leg and configured to rotate the leg, wherein the lid body includes a shaft bore located at a center of the lid body through which the rotating shaft extends, and a surrounding ring located directly under the heat treatment boat, having a second diameter smaller than the first diameter, and formed with the lid body in one-piece and protruding upward from the lid body in a manner of extending the shaft bore to surround the lower end of the leg to form a gap between the surrounding ring and the lower end of the leg, and an inert gas is supplied from an inert gas supply unit to a space between the lid body and the rotating shaft and discharged from the gap into the reaction tube; and
    a cylindrical shield body, having a third diameter smaller than the first diameter, located on the lid body and surrounding the leg and the surrounding ring to prevent a process gas within the reaction tube from moving through the space between the lower end of the leg and the surrounding ring,
    wherein a housing surrounding the rotating shaft is fixed to a lower end of the lid body and the inert gas supply unit is installed in the housing.

2. The apparatus of claim 1, wherein the space extends to the gap along a vertical direction.

3. The apparatus of claim 2, wherein the gap has a size of 0.2 mm to 2.0 mm.

4. The apparatus of claim 1, wherein the surrounding ring has a height of 10 mm to 40 mm.

5. The apparatus of claim 1, wherein a connecting pin is connected to the lower end of the leg and the rotating shaft, the connecting pin being embedded in the lower end of the leg to be not exposed to the outside.

6. The apparatus of claim 1, wherein the leg includes a leg body and the lower end of the leg includes a lower flange protruding radially outward from the leg body.

* * * * *